(12) United States Patent
Suh

(10) Patent No.: US 11,721,793 B2
(45) Date of Patent: Aug. 8, 2023

(54) DISPLAY DEVICE

(71) Applicant: Samsung Display Co., LTD, Yongin-si (KR)

(72) Inventor: Yeongsang Suh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 342 days.

(21) Appl. No.: 17/094,997

(22) Filed: Nov. 11, 2020

(65) Prior Publication Data

US 2021/0257518 A1 Aug. 19, 2021

(30) Foreign Application Priority Data

Feb. 18, 2020 (KR) .................. 10-2020-0019362

(51) Int. Cl.
*H01L 33/48* (2010.01)
*H01L 27/15* (2006.01)
*H01L 33/64* (2010.01)
*H01L 33/62* (2010.01)

(52) U.S. Cl.
CPC .......... *H01L 33/486* (2013.01); *H01L 27/156* (2013.01); *H01L 33/62* (2013.01); *H01L 33/642* (2013.01)

(58) Field of Classification Search
CPC ..... H01L 33/486; H01L 27/156; H01L 33/62; H01L 33/642; H01L 27/3225; H01L 23/373; H01L 23/36; H01L 25/167; H01L 27/3244; H01L 51/529; H01L 27/32; H01L 51/0097; H01L 27/3246; H01L 27/3283; H01L 51/5253; H01L 2251/5338; H01L 27/3258; H01L 51/52; G09F 9/00; G09G 3/20; H05K 7/20954; Y02E 10/549; H10K 59/00; H10K 59/12; H10K 50/87

See application file for complete search history.

(56) References Cited

U.S. PATENT DOCUMENTS

| | | | |
|---|---|---|---|
| 7,417,859 B2 | 8/2008 | Bae et al. | |
| 8,773,859 B2 | 7/2014 | Kim et al. | |
| 10,236,471 B2 | 3/2019 | Oh et al. | |
| 10,741,789 B2 | 8/2020 | Oh et al. | |
| 2006/0158851 A1 | 7/2006 | Bae et al. | |
| 2014/0307396 A1* | 10/2014 | Lee ........................ | H05K 1/189 29/830 |
| 2015/0021570 A1* | 1/2015 | Kim .................... | H01L 51/5293 257/40 |
| 2017/0263891 A1 | 9/2017 | Oh et al. | |
| 2019/0206898 A1 | 7/2019 | Baek | |
| 2019/0173052 A1 | 9/2019 | Oh et al. | |

(Continued)

FOREIGN PATENT DOCUMENTS

| | | |
|---|---|---|
| KR | 10-0670273 | 1/2007 |
| KR | 10-2008-0075282 | 8/2008 |

(Continued)

*Primary Examiner* — Jonathan Han
(74) *Attorney, Agent, or Firm* — H.C. Park & Associates, PLC

(57) ABSTRACT

A display device includes: a display module; a driving chip assembly electrically connected to the display module and including a driving chip and a heat dissipator at least partially surrounding the driving chip; and a main circuit board electrically connected to the driving chip assembly and contacting the heat dissipator.

19 Claims, 6 Drawing Sheets

(56) References Cited

U.S. PATENT DOCUMENTS

2019/0393433 A1* 12/2019 Dagn .................. H01L 51/5253
2020/0192433 A1*  6/2020 Shin ..................... H01L 51/529

FOREIGN PATENT DOCUMENTS

| KR | 10-1450950 | 10/2014 |
| KR | 10-2017-0106589 | 9/2017 |
| KR | 10-2019-0082338 | 7/2019 |

* cited by examiner

DISPLAY DEVICE

CROSS-REFERENCE TO RELATED APPLICATION

This application claims priority from and the benefit of Korean Patent Application No. 10-2020-0019362, filed on Feb. 18, 2020, which is hereby incorporated by reference for all purposes as if fully set forth herein.

BACKGROUND

Field

Example implementations of the present disclosure relate generally to display device including a driving chip assembly, and more particularly, to a driving chip assembly having improved heat dissipation performance.

Discussion of the Background

A display device includes a display panel, a main circuit board, and a driving is chip. Signals generated by the main circuit board are applied to the display panel through the driving chip.

The above information disclosed in this Background section is only for understanding of the background of the inventive concepts, and, therefore, it may contain information that does not constitute prior art.

SUMMARY

Applicant realized that when the temperature of the driving chip of a display device rises, the lifespan of the driving chip decreases.

Display devices constructed according to the principles and example embodiments of the present disclosure provide a driving chip assembly having improved heat dissipation performance. For example, the driving chip assembly may include a driving chip and heat dissipator such as a heat dissipation unit. The heat dissipation unit directly contacts the driving chip and the main circuit board. Therefore, the heat generated by the driving chip is transmitted to the heat dissipation unit, and the heat transmitted to the heat dissipation unit is dissipated to the outside through the main circuit board. As the heat dissipation performance of the driving chip assembly is improved, an increase in temperature of the driving chip is minimized or prevented. As a result, the lifespan of the driving chip increases.

Additional features of the inventive concepts will be set forth in the description which follows, and in part will be apparent from the description, or may be learned by practice of the inventive concepts.

According to one aspect of the present disclosure, a display device includes: a display module; a driving chip assembly electrically connected to the display module and including a driving chip and a heat dissipator at least partially surrounding the driving chip; and a main circuit board electrically connected to the driving chip assembly and contacting the heat dissipator.

The display module may include a first area, a second area, and a third area, which may be sequentially disposed relative to each other in a linear direction, the second area being bendable, and the first area and the third area facing each other.

The driving chip may not overlap the second area and the third area when viewed in a plane.

The driving chip assembly may be coupled to the third area of the display module and the main circuit board.

The driving chip assembly may be mounted on the main circuit board.

The main circuit board may be coupled to the third area of the display module.

The heat dissipator may be in contact directly with the driving chip.

The heat dissipator may include a heat dissipation unit having a recess defined therein, and at least a portion of the driving chip may be accommodated therein.

At least a portion of one surface of the heat dissipator, which may face the driving chip, may have a recess to match a shape of the driving chip.

The driving chip assembly may further include an insulating layer disposed on the heat dissipator.

The driving chip may substantially completely overlap the heat dissipator in a plan view.

The heat dissipator may be in contact directly with a side surface of the main circuit board.

The heat dissipator may be in contact directly with an upper surface of the main circuit board.

According to another aspect of the present disclosure, a display device includes: a display module having a first area, a second area extending from the first area, and a third area extending from the second area and disposed under the first area; a driving chip assembly electrically connected to the display module and including a driving chip that does not overlap the second area and the third area when viewed in a plane and a heat dissipator directly contacting the driving chip; and a main circuit board electrically connected to the driving chip assembly and contacting the heat dissipator.

The heat dissipator may directly contact a side surface of the main circuit board.

The heat dissipator may directly contact an upper surface of the main circuit board.

The heat dissipator may include a heat dissipation unit having a recess therein, and at least a portion of the driving chip may be received in the recess.

At least a portion of one surface of the heat dissipator facing the driving chip may have a recess to match a shape of the driving chip.

The first area may include a main area, the second area may include a bendable area, the third area may include a connection area, and the driving chip assembly may be coupled to the connection area of the display module and the main circuit board.

The first area may include a main area, the second area may include a bendable area, the third area may include a connection area, and the driving chip assembly may be mounted on the main circuit board, and the main circuit board may be coupled to the connection area of the display module.

It is to be understood that both the foregoing general description and the following detailed description are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate example embodiments of the present disclosure, and together with the description serve to explain the inventive concepts.

DETAILED DESCRIPTION

Figure 1:
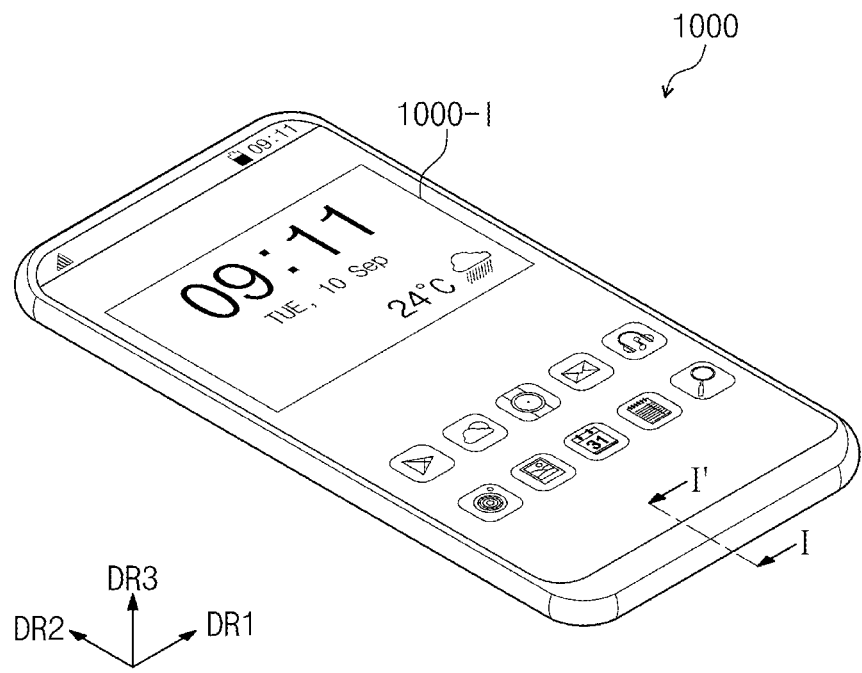
FIG. 1 is a perspective view of an example embodiment illustrating a display device constructed according to principles of the present disclosure.

In the following description, for the purposes of explanation, numerous specific details are set forth in order to provide a thorough understanding of various example embodiments or implementations of the present disclosure. As used herein "embodiments" and "implementations" are interchangeable words that are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, components, regions, layers and/or sections, these elements components, regions, layers and/or sections should not be limited by these terms. These terms are used to distinguish one element, component, region, layer and/or section from another element, component, region, layer and/or section. Thus, a first element, component, region, layer and/or section discussed below could be termed a second element, component, region, layer and/or section without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of idealized example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an example embodiment illustrating a display device constructed according to principles of the present disclosure. Referring to FIG. 1, the display device 1000 may be a device activated in response to electrical signals. The display device 1000 may be applied to various electronic devices including a large-sized electronic item, such as a television set or a monitor, and a small and medium-sized electronic item, such as a mobile phone, a tablet computer, a car navigation unit, a game unit, or a smart watch. In the illustrated example embodiments, a smartphone will be described as a representative example of the display device 1000.

The display device 1000 may display an image 1000-I through a display surface, which is substantially parallel to each of a first direction DR1 and a second direction DR2, toward a third direction DR3. The display surface through which the image 1000-I is displayed may correspond to a front surface of the display device 1000.

In some example embodiments, front (or upper) and rear (or lower) surfaces of each member may be defined with respect to a direction in which the image 1000-I is displayed. The front and rear surfaces may be opposite to each other in the third direction DR3, and a normal line direction of each of the front and rear surfaces may be substantially parallel to the third direction DR3.

Figure 2:
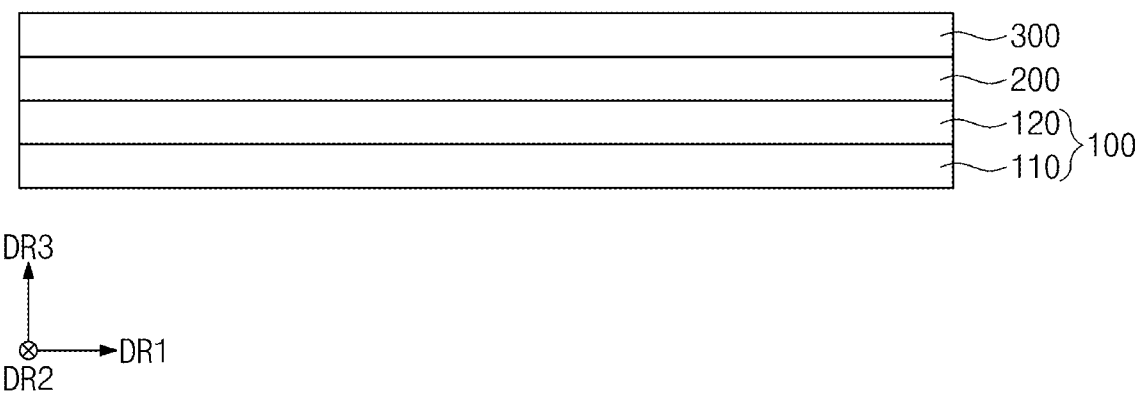
FIG. 2 is a cross-sectional view of the display device of FIG. 1.

FIG. 2 is a cross-sectional view of the display device of FIG. 1.

Referring to FIG. 2, the display device 1000 may include a display module 100, an anti-reflective layer 200, and a window 300. The display module 100 may include a display panel 110 and an input sensor 120.

The display panel 110 may include a configuration appropriate to generate the image 1000-I (refer to FIG. 1). The display panel 110 may be a light-emitting type display panel or other known type of display panel. For example, the display panel 110 may be an organic light emitting display panel or a quantum dot light emitting display panel. The input sensor 120 may be disposed on the display panel 110.

The display panel 110 and the input sensor 120 may be formed through consecutive processes. In this case, the input sensor 120 may is disposed directly on the display panel 110. As used herein, the expression "directly disposed on" means that no intervening elements are present between two components, i.e., the input sensor 120 and the display panel 110. That is, a separate adhesive member is not disposed between the input sensor 120 and the display panel 110 when they are directly disposed on each other.

In some example embodiments, the display panel 110 and the input sensor 120 may be connected to each other by an adhesive member. The adhesive member may include an ordinary adhesive. For example, the adhesive member may be a transparent adhesive member, such as a pressure sensitive adhesive (PSA) film, an optically clear adhesive (OCA) film, or an optically clear resin (OCR).

The input sensor 120 may sense an external input applied from the outside. For example, the external input may be a user input. The user input may include a variety of external inputs, such as a part of user's body, light, heat, pen, or pressure.

The anti-reflective layer 200 may be disposed on the input sensor 120. The anti-reflective layer 200 may decrease the reflectance of an external light incident thereto from the outside. The anti-reflective layer 200 may include a retarder and a polarizer. Alternatively, the anti-reflective layer 200 may include color filters. The color filters may be arranged in a predetermined arrangement, and the arrangement of the color filters may be determined by taking into account emission colors of the pixels. Optionally, the anti-reflective layer 200 may be omitted.

The window 300 may be disposed on the anti-reflective layer 200. The window 300 may include an optically transparent insulating material. For example, the window 300 may include a glass or a plastic material. The window 300 may have a single-layer or multi-layer structure. As an example, the window 300 may include a plurality of plastic films connected to each other by an adhesive or a glass substrate and a plastic film connected to the glass substrate by the adhesive.

The display module 100 and the anti-reflective layer 200 may be connected with each other by the adhesive, and the anti-reflective layer 200 and the window 300 may be connected to each other by the adhesive. However, they should not be limited thereto or thereby, and they may be formed through consecutive processes.

Figure 3:
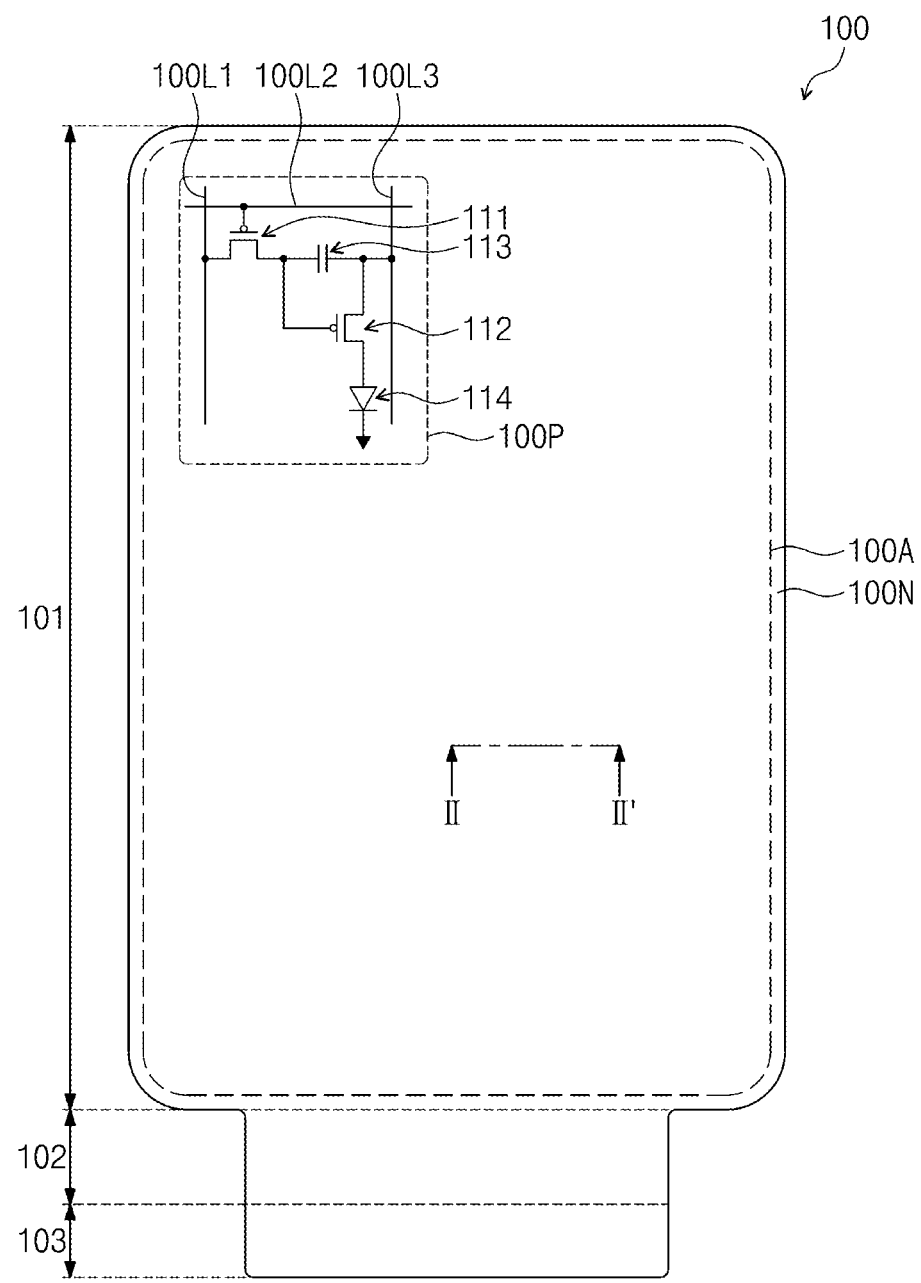
FIG. 3 is a plan view of an example embodiment illustrating a display module of a display device constructed according to principles of the present disclosure.
Figure 3:
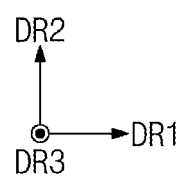

FIG. 3 is a plan view of an example embodiment illustrating a display module of a display device constructed according to principles of the present disclosure. FIGS. 2 and 3 show the display module 100 in its pre-assembled state.

The display module 100 may include a first area 101, a second area 102, and a third area 103. The third area 103, the second area 102, and the first area 101 are sequentially defined in the second direction DR2. In the assembling process, the second area 102 may be bent from the first area 101, and the third area 103 may be disposed under the first area 101. The first area 101 may be referred to as a main area 101, the second area 102 may be referred to as a bendable area 102, and the third area 103 may be referred to as a connection area 103.

The first area 101 may include an active area 100A and a peripheral area 100N. The active area 100A may be activated in response to an electrical signal. For example, the active area 100A may be the area in which the image is displayed and the input is sensed. The peripheral area 100N may surround the active area 100A. A driving circuit or a driving line, which is used to drive the active area 100A, may be disposed in the peripheral area 100N.

The display module 100 may include the display panel 110 and the input sensor 120. The display panel 110 may include a plurality of pixels 100P and a plurality of signal lines 100L1, 100L2, and 100L3. The signal lines 100L1, 100L2, and 100L3 may be connected to the pixels 100P and may apply electrical signals to the pixels 100P.

The signal lines 100L1, 100L2, and 100L3 shown in FIG. 3 may include a data line 100L1, a scan line 100L2, and a power line 100L3. However, this is merely example, and the signal lines 100L1, 100L2, and 100L3 may further include at least one of an initialization voltage line and a light emitting control line and should not be particularly limited.

The pixels 100P may be arranged in the active area 100A. In some example embodiments, an equivalent circuit of one pixel 100P among the pixels 100P is shown as a representative example. The representative pixel 100P may include a first transistor 111, a second transistor 112, a capacitor 113, and a light emitting element 114. The first transistor 111 may be a switching element that controls an on-off of the pixel 100P. The first transistor 111 may transmit or block a data signal applied thereto through the data line 100L1 in response to a scan signal applied thereto through the scan line 100L2.

The capacitor 113 may be connected to the first transistor 111 and the power line 100L3. The capacitor 113 may be charged with an electric charge by the amount corresponding to the difference between the data signal transmitted from the first transistor 111 and a first power signal applied to the power line 100L3.

The second transistor 112 may be connected to the first transistor 111, the capacitor 113, and the light emitting element 114. The second transistor 112 may control the amount of driving current flowing through the light emitting element 114 in response to the amount of the electric charge charged in the capacitor 113. The turn-on time of the second transistor 112 may be determined in accordance with the amount of the electric charge charged in the capacitor 113. The second transistor 112 may provide the first power signal applied thereto through the power line 100L3 to the light emitting element 114 during its turn-on time.

The light emitting element 114 may generate light or may control the amount of the light in response to electrical signals. For example, the light emitting element 114 may include an organic light emitting element or a quantum dot light emitting element.

The light emitting element 114 may be connected to a power terminal and may receive a power signal (hereinafter, referred to as a "second power signal") different from the first power signal provided through the power line 100L3. A driving current corresponding to the difference between an electrical signal provided from the second transistor 112 and the second power signal flows through the light emitting element 114, and the light emitting element 114 may generate light corresponding to the magnitude of the driving current. This is merely example, and the pixel 100P may include electronic elements having various configurations and arrangements, and, it should not be particularly limited.

Figure 4:
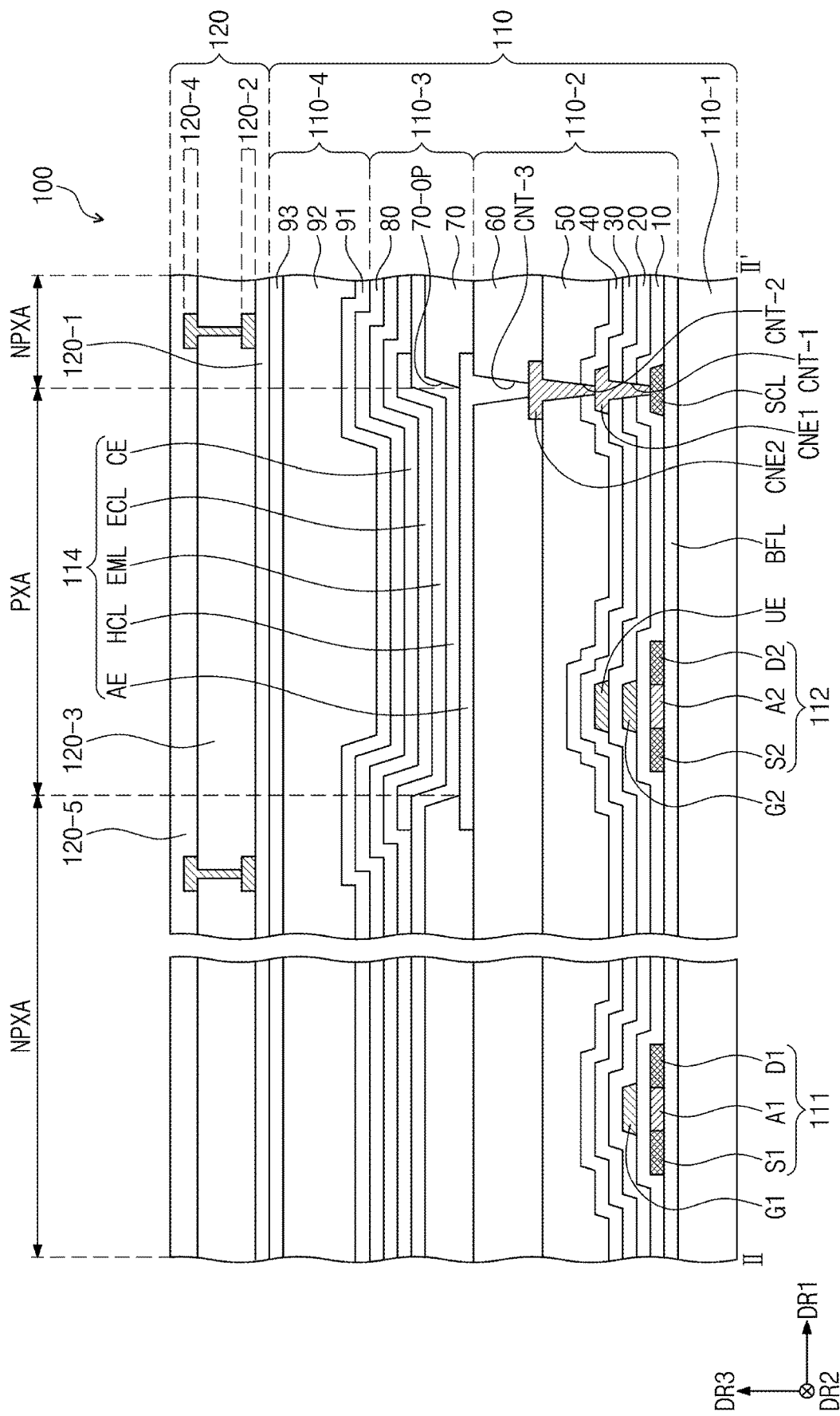
FIG. 4 is a cross-sectional view taken along a line II-IF of FIG. 3.

FIG. 4 is a cross-sectional view taken along a line II-IF of FIG. 3. Referring to FIG. 4, the display panel 110 may include a plurality of insulating layers, a semiconductor pattern, a conductive pattern, and a signal line. An insulating layer, a semiconductor layer, and a conductive layer may be formed by a coating or depositing process. Then, the insulating layer, the semiconductor layer, and the conductive layer may be selectively patterned by a photolithography process. The semiconductor pattern, the conductive pattern, and the signal line included in a circuit element layer 110-2 and a display element layer 110-3, which are disposed on a base layer 110-1, may be formed. Afterwards, an encapsulation layer 110-4 that covers the display element layer 110-3 may be formed.

The base layer 110-1 may include a synthetic resin film. The synthetic resin film may include a heat-curable resin. The base layer 110-1 may have a multi-layer structure. For instance, the base layer 110-1 may have a three-layer structure of a synthetic resin layer, an adhesive layer, and a synthetic resin layer. In particular, the synthetic resin layer may be a polyimide-based resin layer, however, the material for the synthetic resin layer should not be particularly limited. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin. The base layer 110-1 may include a glass substrate or an organic/inorganic composite substrate.

At least one inorganic layer may be formed on an upper surface of the base layer 110-1. The inorganic layer may include at least one of an aluminum oxide, a titanium oxide, a silicon oxide, a silicon oxynitride, a zirconium oxide, and a hafnium oxide. The inorganic layer may be formed in multiple layers. The inorganic layers may form a barrier layer and/or a buffer layer. In some example embodiments, the display panel 110 may include a buffer layer BFL.

The buffer layer BFL may increase a coupling force between the base layer 110-1 and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include a polysilicon, however, it should not be limited thereto or thereby. The semiconductor pattern may include an amorphous silicon or a metal oxide.

FIG. 4 illustrates only a portion of the semiconductor pattern, and the semiconductor pattern may be provided in other areas as well. The semiconductor pattern may be arranged in a specific configuration over the pixels 100P (refer to FIG. 3). The semiconductor pattern may have different electrical properties depending on whether it is doped. The semiconductor pattern may include a doped region and a non-doped region. The doped region may be doped with an N-type dopant or a P-type dopant. A P-type transistor may include a doped region doped with the P-type dopant.

The doped region may have a conductivity greater than that of the non-doped region and may substantially serve as an electrode or signal line. The non-doped region may substantially correspond to an active (or channel). In other words, a portion of the semiconductor pattern may be the active of the transistor, another portion of the semiconductor pattern may be a source or a drain of the transistor, and the other portion of the semiconductor pattern may be a connection electrode or a connection signal line.

As shown in FIG. 4, a source S1, an active A1, and a drain D1 of the first transistor 111 may be formed from the semiconductor pattern, and a source S2, an active A2, and a drain D2 of the second transistor 112 may be formed from the semiconductor pattern. The sources S1 and S2 and the drains D1 and D2 may extend in opposite directions to each other from the actives A1 and A2. FIG. 4 shows a portion of a connection signal line SCL formed from the semiconductor pattern. The connection signal line SCL may be connected to the drain D2 of the second transistor 112 in a plan view.

A first insulating layer 10 may be disposed on the buffer layer BFL. The first insulating layer 10 may commonly overlap the pixels 100P (refer to FIG. 3) and may cover the semiconductor pattern. The first insulating layer 10 may be an inorganic layer and/or an organic layer and may have a single-layer or multi-layer structure. The first insulating layer 10 may include at least one of an aluminum oxide, a titanium oxide, a silicon oxide, a silicon oxynitride, a zirconium oxide, and a hafnium oxide. In some example embodiments, the first insulating layer 10 may have a single-layer structure of a silicon oxide layer. Not only the first insulating layer 10, but also an insulating layer of the circuit element layer 110-2 described below may be an inorganic layer and/or an organic layer and may have a single-layer or multi-layer structure. The inorganic layer may include at least one of the above-mentioned materials.

Gates G1 and G2 may be disposed on the first insulating layer 10. The gate G1 may correspond to a portion of a metal pattern. The gates G1 and G2 may overlap the actives A1 and A2, respectively. The gates G1 and G2 may be used as a mask in a process of doping the semiconductor pattern.

A second insulating layer 20 may be disposed on the first insulating layer 10 and may cover the gates G1 and G2. The second insulating layer 20 may commonly overlap the pixels 100P (refer to FIG. 3). The second insulating layer 20 may be an inorganic layer and/or an organic layer and may have a single-layer or multi-layer structure. In some example embodiments, the second insulating layer 20 may have a single-layer structure of a silicon oxide layer.

An upper electrode UE may be disposed on the second insulating layer 20. The upper electrode UE may overlap the gate G2 of the second transistor 112. The upper electrode UE may be a portion of metal pattern. A portion of the gate G2 and the upper electrode UE overlapping the portion of the gate G2 may define the capacitor 113 as depicted in FIG. 3.

A third insulating layer 30 may be disposed on the second insulating layer 20 and may cover the upper electrode UE. In some example embodiments, the third insulating layer 30 may have a single-layer structure of a silicon oxide layer. A first connection electrode CNE1 may be disposed on the third insulating layer 30. The first connection electrode CNE1 may be connected to the connection signal line SCL through a contact hole CNT-1 defined through the first, second, and third insulating layers 10, 20, and 30.

A fourth insulating layer 40 may be disposed on the third insulating layer 30. The fourth insulating layer 40 may have a single-layer structure of a silicon oxide layer. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer. A first electrode AE may be disposed on the sixth insulating layer 60. The first electrode AE may be connected to the second connection electrode CNE2 through a contact hole CNT-3 defined through the sixth insulating layer 60. A pixel definition layer 70 may be disposed on the sixth insulating layer 60 and may cover a portion of the first electrode AE. An opening 70-OP may be defined through a pixel definition layer 70. At least a portion of the first electrode AE may be exposed through the opening 70-OP of the pixel definition layer 70.

The active area 100A, as depicted in FIG. 3, may include a light emitting area PXA and a non-light-emitting area NPXA defined adjacent to the light emitting area PXA. The non-light-emitting area NPXA may surround the light emitting area PXA. In some example embodiments, the light emitting area PXA may be defined to correspond to the portion of the first electrode AE exposed through the opening 70-OP.

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may be disposed in the area corresponding to the opening 70-OP. That is, the light emitting layer EML may be formed in each of the pixels 100P, as depicted in FIG. 3, after being divided into portions.

An electron control layer ECL may be disposed on the light emitting layer EML. The electron control layer ECL may include an electron transport layer and may further include an electron injection layer. The hole control layer HCL and the electron control layer ECL may be commonly formed in the plural pixels 100P using an open mask. A second electrode CE may be disposed on the electron control layer ECL. The second electrode CE may have an integral shape and may be commonly disposed in the pixels 100P, as depicted in FIG. 3.

A capping layer 80 may be disposed on the second electrode CE and may be in contact with the second electrode CE. The capping layer 80 may include an organic material. The capping layer 80 may protect the second electrode CE from the following process, for instance, a sputtering process, and may increase a light emitting efficiency of the light emitting element 114. The capping layer 80 may have a refractive index greater than that of a first inorganic layer 91 described below.

The encapsulation layer 110-4 may be disposed on the display element layer 110-3. The encapsulation layer 110-4 may include the first inorganic layer 91, an organic layer 92, and a second inorganic layer 93. The first inorganic layer 91 and the second inorganic layer 93 may protect the display element layer 110-3 from moisture/oxygen, and the organic layer 92 may protect the display element layer 110-3 from a foreign substance such as dust particles. The first inorganic layer 91 and the second inorganic layer 93 may include a silicon nitride layer, a silicon oxynitride layer, or a silicon oxide layer. According to some example embodiments, the first inorganic layer 91 and the second inorganic layer 93 may include a titanium oxide layer or an aluminum oxide layer. The organic layer 92 may include an acrylic-based organic layer, however, it should not be limited thereto or thereby.

In some example embodiments, an inorganic layer, for example, an lithium fluoride (LiF) layer, may be further disposed between the capping layer 80 and the first inorganic layer 91. The LiF layer may increase the light emitting efficiency of the light emitting element 114.

The input sensor 120 may include a base insulating layer 120-1, a first conductive layer 120-2, a sensing insulating layer 120-3, a second conductive layer 120-4, and a cover insulating layer 120-5. The input sensor 120 may be formed through consecutive processes after the display panel 110 is formed, however, it should not be limited thereto or thereby.

The base insulating layer 120-1 may be disposed directly on the display panel 110. For example, the base insulating layer 120-1 may directly contact the second inorganic layer 93. The base insulating layer 120-1 may have a single-layer or multi-layer structure. Alternatively, the base insulating layer 120-1 may be omitted. Further still, the base insulating layer 120-1 may be coupled to the display panel 110 by an adhesive member after being formed on a separate base layer.

Each of the first conductive layer 120-2 and the second conductive layer 120-4 may have a single-layer structure or a stacked structure in which layers are stacked in the third direction DR3. The conductive layer having the single-layer structure may include a metal layer or a transparent conductive layer. The metal layer may include molybdenum, silver, titanium, copper, aluminum, or alloys thereof. The transparent conductive layer may include transparent conductive oxide, such as indium tin oxide (ITO), indium zinc oxide (IZO), zinc oxide (ZnO), or indium zinc tin oxide (IZTO). The transparent conductive layer may include a conductive polymer such as a poly(3,4-ethylenedioxythiophene) (PEDOT), a metal nanowire, or a graphene.

The conductive layer having the multi-layer structure may include metal layers. The metal layers may have a three-layer structure of titanium/aluminum/titanium. The conductive layer having the multi-layer structure may include at least one metal layer and at least one transparent conductive layer.

Each of the first conductive layer 120-2 and the second conductive layer 120-4 may include patterns that form sensing electrodes. The input sensor 120 may obtain information about the external input based on a variation in capacitance between the sensing electrodes.

The sensing insulating layer 120-3 may be disposed between the first conductive layer 120-2 and the second conductive layer 120-4 and may cover the first conductive layer 120-2. A portion of the second conductive layer 120-4 may be electrically connected to a portion of the first conductive layer 120-2 through a contact hole defined through the sensing insulating layer 120-3. The cover insulating layer 120-5 may be disposed on the sensing insulating layer 120-3 and may cover the second conductive layer 120-4.

At least one of the sensing insulating layer 120-3 and the cover insulating layer 120-5 may include an inorganic layer. The inorganic layer may include at least one of an aluminum oxide, a titanium oxide, a silicon oxide, a silicon oxynitride, zirconium oxide, and a hafnium oxide.

At least one of the sensing insulating layer 120-3 and the cover insulating layer 120-5 may include an organic layer. The organic layer may include at least one of an acrylic-based resin, a methacrylic-based resin, a polyisoprene, a vinyl-based resin, an epoxy-based resin, a urethane-based resin, a cellulose-based resin, a siloxane-based resin, a polyimide-based resin, a polyamide-based resin, and a perylene-based resin.

Figure 5:
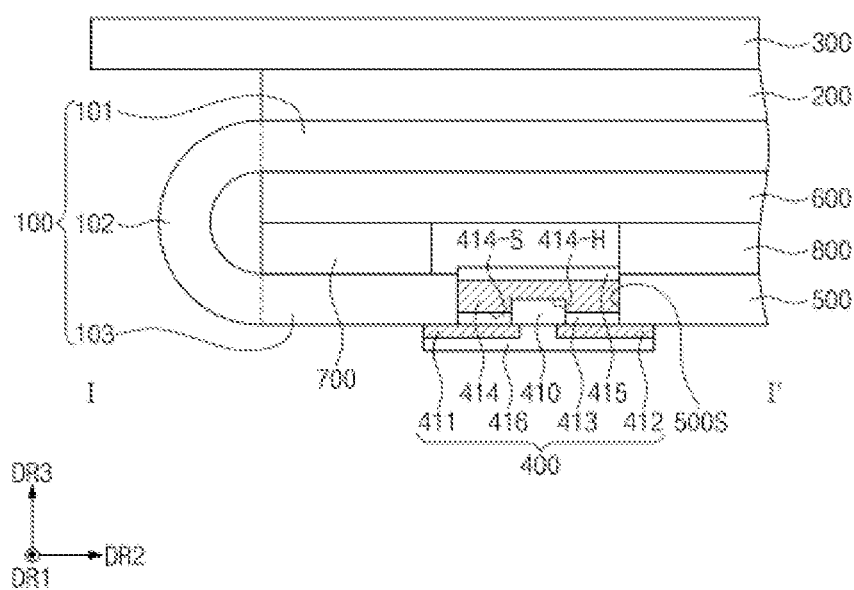
FIG. 5 is a cross-sectional view taken along a line I-I' of FIG. 1.

FIG. 5 is a cross-sectional view taken along a line I-I' of FIG. 1.

FIG. 5 illustrates only some components of the display device 1000. The second area 102 of the display module 100 may be bent, and the third area 103 may be disposed under the first area 101. The first area 101 and the third area 103 may face each other.

The display device 1000 may include the display module 100, a driving chip assembly 400 electrically connected to the display module 100, a main circuit board 500 electrically connected to the driving chip assembly 400, a lower film 600 disposed on a rear surface of the first area 101, a spacer 700 disposed between the lower film 600 and the third area 103, and an adhesive member 800 disposed between the main circuit board 500 and the lower film 600.

The driving chip assembly 400 may be electrically connected to the display module 100, and the main circuit board 500 may be electrically connected to the driving chip assembly 400. A signal controller (or timing controller) may be mounted on the main circuit board 500. The signal controller may receive image data and control signals from an external graphic controller. The signal controller may provide the control signals to the display module 100, as depicted in FIG. 4.

The driving chip assembly 400 may electrically connect the main circuit board 500 and the display module 100. A portion of the driving chip assembly 400 may be coupled to the third area 103 of the display module 100, and the other portion of the driving chip assembly 400 may be coupled to the main circuit board 500.

The driving chip assembly 400 may include a driving chip 410, a first line 411, a second line 412, an insulating layer 413, a heat dissipator, which may be in the form of a heat dissipation unit 414, an upper insulating layer 415, and a lower insulating layer 416.

The driving chip 410 may be a data driving circuit. The driving chip 410 may transmit signals applied thereto from the main circuit board 500 to the display module 100. For example, the driving chip 410 may output signals through the data line 100L1, as depicted in FIG. 3.

The first line 411 may electrically connect the driving chip 410 and the display module 100, and the second line 412 may electrically connect the driving chip 410 and the main circuit board 500. The driving chip 410 may be disposed between the display module 100 and the main circuit board 500. Accordingly, the driving chip 410 may not overlap the second area 102 and the third area 103 when viewed in the plane elevational view shown in FIG. 5. The driving chip 410 may be spaced apart and offset from the third area 103 when viewed in the plane. Therefore, the display device 1000 may have a thickness smaller than the thickness when the driving chip 410 overlaps the third area 103. The expression "when viewed in the plane" may be "when viewed in plane extending substantially parallel to the third direction DR3".

The insulating layer 413 may cover a portion of each of the first line 411 and the second line 412. The insulating layer 413 may have a thickness equal to or smaller than the thickness of the driving chip 410, and a portion of the driving chip 410 may be exposed without being covered by the insulating layer 413.

The heat dissipation unit 414 may be disposed on the insulating layer 413 and the driving chip 410. The heat dissipation unit 414 may be in contact directly with the driving chip 410. As used herein, the expression "being in contact directly with" means that no other elements are present between two components, i.e., the heat dissipation unit 414 and the driving chip 410. Because the driving chip 410 may be in contact directly with the heat dissipation unit 414, heat generated by the driving chip 410 may be easily transferred to the heat dissipation unit 414.

The heat dissipation unit 414 may include a graphite, an organic/inorganic composite material in which carbon nanotubes are distributed, or a metal layer formed of a metal material that easily transfers the heat, such as aluminum and copper. However, this is merely example, and the material for the heat dissipation unit 414 should not be particularly limited.

The heat dissipation unit 414 may be attached to the driving chip 410 and the insulating layer 413 or may be formed by a coating process. In the case where the heat dissipation unit 414 is coated on the driving chip 410 and the insulating layer 413, the heat dissipation unit 414 may be in close contact with the driving chip 410.

A surface 414-S of the heat dissipation unit 414 may be generally curved to correspond to the shape of the driving chip 410. A recess 414-H corresponding to the shape of the driving chip 410 may be defined in the surface 414-S of the heat dissipation unit 414. A portion of the driving chip 410 may be accommodated in the recess 414-H. In this case, the contact area between the heat dissipation unit 414 and the driving chip 410 may increase, and the heat dissipation performance of the driving chip assembly 400 may be improved.

Figure 6:
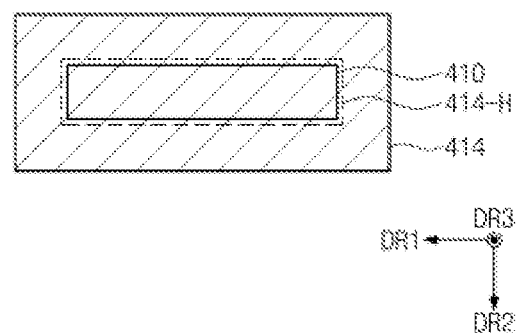
FIG. 6 is a plan view of an example embodiment illustrating some components of the driving chip assembly constructed according to principles of the present disclosure.

FIG. 6 is a plan view of an example embodiment illustrating some components of the driving chip assembly constructed according to principles of the present disclosure. FIG. 6 shows the heat dissipation unit 414 and the driving chip 410. The driving chip 410 may in its entirety overlie the heat dissipation unit 414 in a plan view. When viewed in a plane, the heat dissipation unit 414 may surround the driving chip 410. Accordingly, the heat generated by the driving chip 410 may be transferred to the heat dissipation unit 414 in all directions on a plane. Therefore, the heat dissipation performance of the driving chip assembly 400 may be improved.

Referring to FIG. 5 again, the upper insulating layer 415 may be disposed on the heat dissipation unit 414. The upper insulating layer 415 may be disposed only on an upper surface of the heat dissipation unit 414. That is, side surfaces of the heat dissipation unit 414 may not be covered by the upper insulating layer 415. In some example embodiments, the upper insulating layer 415 may be omitted.

Some of the side surfaces of the heat dissipation unit 414 may be in contact directly with a side surface 500S of the main circuit board 500. Accordingly, the heat generated by the driving chip 410 may be transferred to the main circuit board 500 through the heat dissipation unit 414 and then may be dissipated to the outside. As the heat dissipation performance of the driving chip assembly 400 is improved, an increase in temperature of the driving chip 410 may be reduced or prevented from occurring. As a result, the lifespan of the driving chip 410 may increase.

The lower insulating layer 416 may be disposed under the first line 411 and the second line 412. The lower insulating layer 416 may cover the first line 411, the second line 412, and a lower surface of the driving chip 410.

The lower film 600 may protect a rear surface of the display module 100. In addition, the lower film 600 may dissipate the heat generated by the display device 1000 and may shield electromagnetic waves. The lower film 600 may include an organic/inorganic composite material in which carbon nanotubes are distributed or a metal layer formed of a metal material that easily transfers the heat, such as aluminum and copper. However, this is merely example, and the material for the lower film 600 should not be particularly limited.

The spacer 700 may maintain a gap between the lower film 600 and the third area 103. The adhesive member 800 may fix the main circuit board 500 to the lower film 600.

Figure 7:
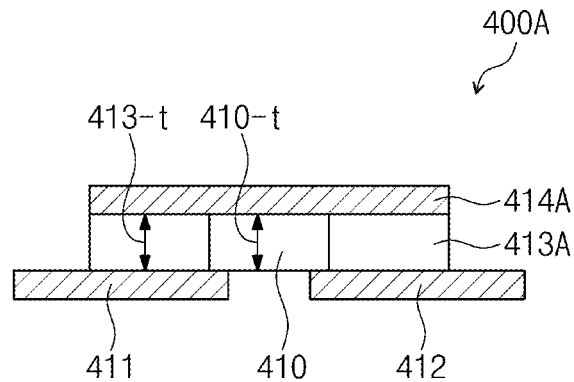
FIG. 7 is a cross-sectional view of another example embodiment illustrating a driving chip assembly constructed according to principles of the present disclosure.

FIG. 7 is a cross-sectional view of another example embodiment illustrating a driving chip assembly constructed according to principles of the present disclosure.

Referring to FIG. 7, the driving chip assembly 400A may include a driving chip 410, a first line 411, a second line 412, an insulating layer 413A, and a heat dissipation unit 414A.

The insulating layer 413A has a thickness 413-t that is substantially the same as the thickness 410-t of the driving chip 410. Accordingly, an upper surface of the driving chip 410 may be surrounded by an upper surface of the insulating layer 413A, and the upper surface of the driving chip 410 may not be covered by the insulating layer 413A when viewed in a plane.

The heat dissipation unit 414A may be disposed on an upper surface of the driving chip 410 and an upper surface of the insulating layer 413A. The heat dissipation unit 414A may be in contact directly with the driving chip 410. Accordingly, the heat generated by the driving chip 410 may be transferred to the outside through the heat dissipation unit 414A.

As described with reference to FIG. 5, the heat dissipation unit 414A may be in contact directly with the main circuit board 500, as depicted in FIG. 5 and the heat transferred to the heat dissipation unit 414A may be dissipated to the outside through the main circuit board 500, as depicted in FIG. 5.

Figure 8:
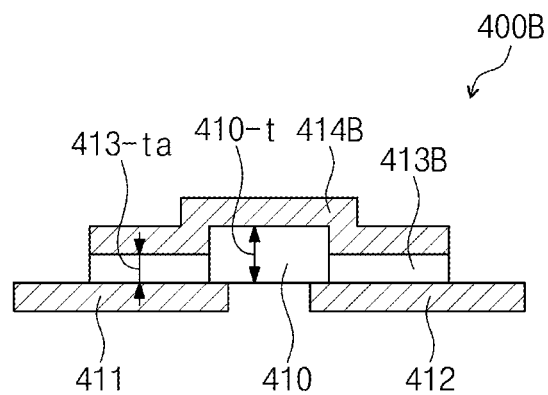
FIG. 8 is a cross-sectional view of still another example embodiment illustrating a driving chip assembly constructed according to principles of the present disclosure.

FIG. 8 is a cross-sectional view of still another example embodiment illustrating a driving chip assembly constructed according to principles of the present disclosure.

Referring to FIG. 8, the driving chip assembly 400B may include a driving chip 410, a first line 411, a second line 412, an insulating layer 413B, and a heat dissipation unit 414B.

The insulating layer 413B may have a thickness 413-ta smaller than the thickness 410-t of the driving chip 410. Accordingly, a portion of the driving chip 410 may protrude from an upper surface of the insulating layer 413B, and the portion of the driving chip 410 may not be covered by the insulating layer 413B.

The heat dissipation unit 414B may be disposed on the portion of the driving chip 410 and the upper surface of the insulating layer 413B. The heat dissipation unit 414B may have a generally curved shape to correspond to the protruding portion of the driving chip 410.

As described above with reference to FIG. 5, the heat dissipation unit 414B may be in contact directly with the main circuit board 500, as depicted in FIG. 5, and the heat transferred to the heat dissipation unit 414B may be dissipated to the outside through the main circuit board 500, as depicted in FIG. 5.

Figure 9:
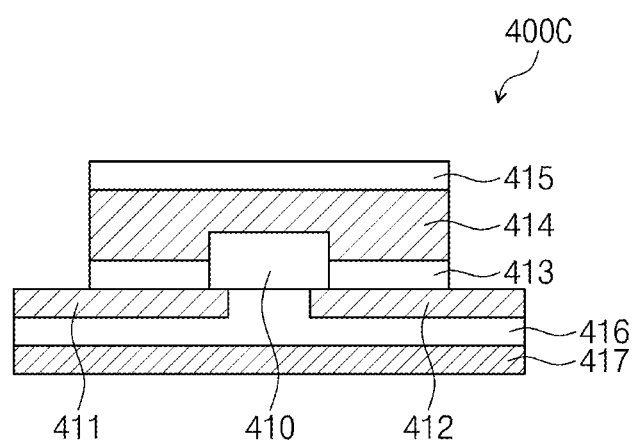
FIG. 9 is a cross-sectional view of yet another example embodiment illustrating a driving chip assembly constructed according to principles of the present disclosure.

FIG. 9 is a cross-sectional view of yet another example embodiment illustrating a driving chip assembly constructed according to principles of the present disclosure.

When compared with the driving chip assembly 400 as described with reference to FIG. 5, the driving chip assembly 400C of FIG. 9 may further include an auxiliary heat dissipation unit 417 disposed under a lower insulating layer 416. The auxiliary heat dissipation unit 417 may be attached to the lower insulating layer 416 or may be formed by a coating process.

The auxiliary heat dissipation unit 417 may include a graphite, an organic/inorganic composite material in which carbon nanotubes are distributed or a metal layer formed of a metal material that easily transfers the heat, such as aluminum and copper. However, this is merely example, and the material for the auxiliary heat dissipation unit 417 should not be particularly limited.

Figure 10:
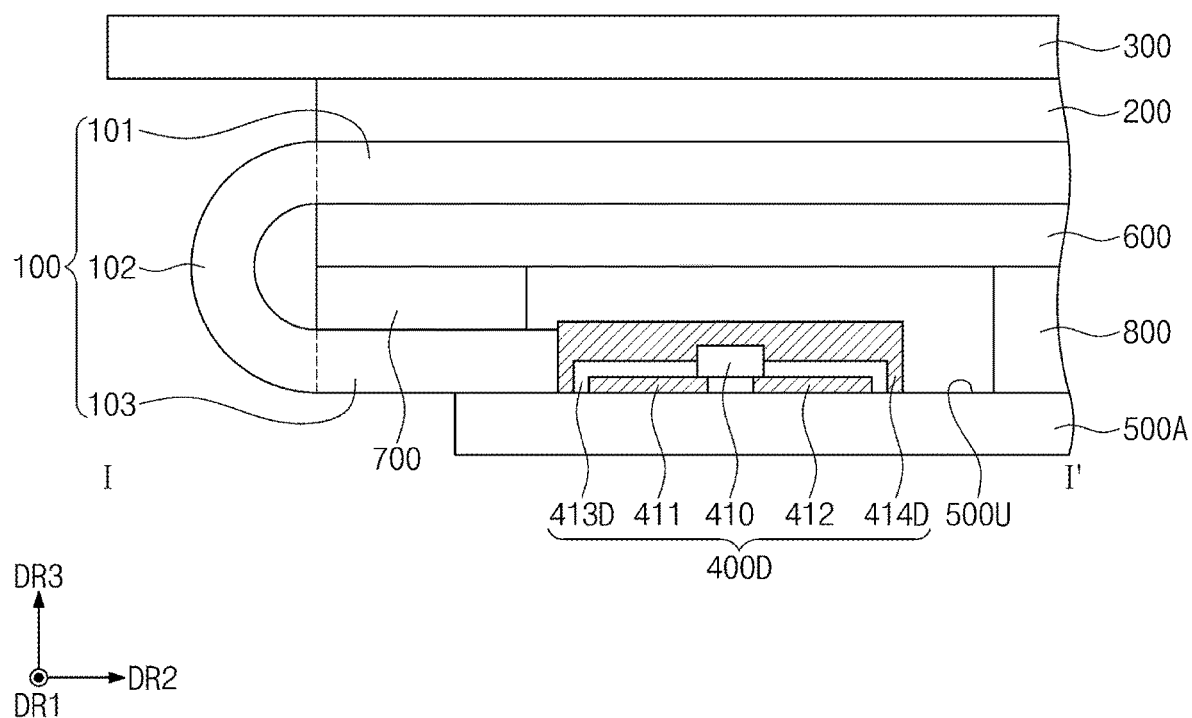
FIG. 10 is a cross-sectional view of another example embodiment taken along the line I-I' of FIG. 1 constructed according to principles of the present disclosure.

FIG. 10 is a cross-sectional view of another example embodiment taken along the line I-I' of FIG. 1 constructed according to principles of the present disclosure.

Referring to FIG. 10, a main circuit board 500A may be coupled to the third area 103 of a display module 100. A driving chip assembly 400D may be mounted on the main circuit board 500A.

The driving chip assembly 400D may include a driving chip 410, a first line 411, a second line 412, an insulating layer 413D, and a heat dissipation unit 414D. The driving chip 410 may be a data driving circuit. The driving chip 410 may transmit signals applied thereto from the main circuit board 500A to the display module 100. When viewed in a plane, the driving chip 410 may not overlap the second area 102 and the third area 103.

The insulating layer 413D may cover the first line 411 and the second line 412. The heat dissipation unit 414D and the first line 411 may be insulated from each other by the insulating layer 413D, and the heat dissipation unit 414D and the second line 412 may be insulated from each other by the insulating layer 413D.

The heat dissipation unit 414D may be disposed above the insulating layer 413D and the driving chip 410. The heat dissipation unit 414D may be in contact directly with the driving chip 410. In addition, a portion of the heat dissipation unit 414D may extend to be in contact directly with an upper surface 500U of the main circuit board 500A. Accordingly, the heat generated by the driving chip 410 may be transferred to the main circuit board 500A through the heat dissipation unit 414D and then may be discharged to the outside.

Although certain example embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module;
a driving chip assembly electrically connected to the display module and including a driving chip and a heat dissipator at least partially surrounding the driving chip; and
a main circuit board electrically connected to the driving chip assembly and contacting the heat dissipator,
wherein the heat dissipator is in contact directly with the driving chip and the main circuit board.

2. The display device of claim 1, wherein the display module comprises a first area, a second area, and a third area, which are sequentially disposed relative to each other in a linear direction, the second area being bendable, and the first area and the third area facing each other.

3. The display device of claim 2, wherein the driving chip does not overlap the second area and the third area when viewed in a plane.

4. The display device of claim 2, wherein the driving chip assembly is coupled to the third area of the display module and the main circuit board, and
wherein the main circuit board is spaced apart from the third area of the display module with the driving chip interposed therebetween.

5. The display device of claim 2, wherein the driving chip assembly is mounted on the main circuit board.

6. The display device of claim 5, wherein the main circuit board is coupled to the third area of the display module.

7. The display device of claim 1, wherein the heat dissipator comprises a heat dissipation unit having a recess defined therein, and at least a portion of the driving chip is accommodated therein.

8. The display device of claim 1, wherein at least a portion of one surface of the heat dissipator, which faces the driving chip, has a recess to match a shape of the driving chip.

9. The display device of claim 1, wherein the driving chip assembly further comprises an insulating layer disposed on the heat dissipator.

10. The display device of claim 1, wherein the driving chip substantially completely overlaps the heat dissipator in a plan view.

11. The display device of claim 1, wherein the heat dissipator is in contact directly with a side surfaced of the main circuit board.

12. The display device of claim 1, wherein the heat dissipator is in contact directly with an upper surface of the main circuit board.

13. A display device comprising:
a display module having a first area, a second area extending from the first area, and a third area extending from the second area and disposed under the first area;
a driving chip assembly electrically connected to the display module and including a driving chip that does not overlap the second area and the third area when viewed in a plane and a heat dissipator directly contacting the driving chip; and
a main circuit board electrically connected to the driving chip assembly and directly contacting the heat dissipator.

14. The display device of claim 13, wherein the heat dissipator directly contacts a side surfaced of the main circuit board, and
wherein the main circuit board is spaced apart from the third area of the display module with the driving chip interposed therebetween.

15. The display device of claim 13, wherein the heat dissipator directly contacts an upper surface of the main circuit board.

16. The display device of claim 13, wherein the heat dissipator comprises a heat dissipation unit having a recess therein, and at least a portion of the driving chip is received in the recess.

17. The display device of claim 13, wherein at least a portion of one surface of the heat dissipator facing the driving chip has a recess to match a shape of the driving chip.

18. The display device of claim 13, wherein the first area comprises a main area, the second area comprises a bendable area, the third area comprises a connection area, and the driving chip assembly is coupled to the connection area of the display module and the main circuit board.

19. The display device of claim 13, wherein the first area comprises a main area, the second area comprises a bendable area, the third area comprises a connection area, and the driving chip assembly is mounted on the main circuit board, and the main circuit board is coupled to the connection area of the display module.

\* \* \* \* \*